(12) United States Patent
Park et al.

(10) Patent No.: US 9,040,337 B2
(45) Date of Patent: May 26, 2015

(54) STRETCHABLE ELECTRONIC DEVICE AND METHOD OF MANUFACTURING SAME

(71) Applicant: Electronics and Telecommunications Research Institute, Daejeon (KR)

(72) Inventors: Chan Woo Park, Daejeon (KR); Jae Bon Koo, Daejeon (KR); Sang Chul Lim, Daejeon (KR); Ji-Young Oh, Daejeon (KR); Soon-Won Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 139 days.

(21) Appl. No.: 13/840,299

(22) Filed: Mar. 15, 2013

(65) Prior Publication Data

US 2014/0104793 A1    Apr. 17, 2014

(30) Foreign Application Priority Data

Oct. 17, 2012  (KR) ................. 10-2012-0115432

(51) Int. Cl.
| | |
|---|---|
| *H01L 21/76* | (2006.01) |
| *H05K 1/02* | (2006.01) |
| *H01L 21/768* | (2006.01) |
| *H01L 23/538* | (2006.01) |
| *H05K 3/46* | (2006.01) |

(52) U.S. Cl.
CPC ........ *H05K 1/0283* (2013.01); *H01L 21/76898* (2013.01); *H05K 3/4644* (2013.01); *H05K 2201/097* (2013.01); *H01L 23/5387* (2013.01); *H01L 2924/0002* (2013.01)

(58) Field of Classification Search
CPC .... H01L 21/00; H01L 21/76; H01L 21/76838
USPC ....................... 438/28, 51, 108, 119, 456, 457
See application file for complete search history.

(56) References Cited

U.S. PATENT DOCUMENTS

| | | | |
|---|---|---|---|
| 8,198,621 | B2 | 6/2012 | Rogers et al. |
| 8,329,493 | B2* | 12/2012 | Mascaro et al. ................ 438/51 |
| 2004/0238819 | A1* | 12/2004 | Maghribi et al. ............... 257/57 |
| 2004/0243204 | A1* | 12/2004 | Maghribi et al. ............ 607/115 |
| 2009/0317639 | A1* | 12/2009 | Axisa et al. ................ 428/411.1 |
| 2012/0051005 | A1 | 3/2012 | Vanfleteren et al. |

(Continued)

FOREIGN PATENT DOCUMENTS

KR    10-2001-0075974 A    8/2001

OTHER PUBLICATIONS

Tsuyoshi Sekitani, et al., "A Rubberlike Stretchable Active Matrix Using Elastic Conductors", Science, Sep. 12, 2008, pp. 1468-1472, vol. 321.

(Continued)

*Primary Examiner* — Michael Lebentritt

(57) ABSTRACT

Provided are a stretchable electronic device and a method of manufacturing the same. The manufacturing method includes forming coil interconnection on a first substrate, forming a first stretchable insulating layer that covers the coil interconnection, forming a second substrate on the first stretchable insulating layer, separating the first substrate from the coiling interconnection and the first stretchable insulating layer, and forming a transistor on the coil interconnection.

14 Claims, 12 Drawing Sheets

(56) References Cited

U.S. PATENT DOCUMENTS

| | | | |
|---|---|---|---|
| 2012/0279762 A1* | 11/2012 | Hur et al. | 174/254 |
| 2014/0134840 A1* | 5/2014 | Koo et al. | 438/666 |
| 2014/0218872 A1* | 8/2014 | Park et al. | 361/749 |

OTHER PUBLICATIONS

Dahl-Young Khang, et al., "A Stretchable Form of Single-Crystal Silicon for High-Performance Electronics on Rubber Substrates", Science, Jan. 13, 2006, pp. 208-212, vol. 311.

Feng Xu, et al., "Controlled 3D Buckling of Silicon Nanowires for Stretchable Electronics", ACS Nano, 2011, pp. 672-678, vol. 5, No. 1.

Yugang Sun, et al., "Controlled buckling of semiconductor nanoribbons for stretchable electronics", Nature Nanotechnology, Dec. 5, 2006, pp. 201-207, vol. 1.

Darren S. Gray, et al., "High-Conductivity Elastomeric Electronics", Advanced Materials, Mar. 5, 2004, pp. 393-397, vol. 16, No. 5, Wiley-VCH Verlag GmbH & Co.

* cited by examiner

STRETCHABLE ELECTRONIC DEVICE AND METHOD OF MANUFACTURING SAME

CROSS-REFERENCE TO RELATED APPLICATIONS

This U.S. non-provisional patent application claims priority under 35 U.S.C. §119 of Korean Patent Application No. 10-2012-0115432, filed on Oct. 17, 2012, the entire contents of which are hereby incorporated by reference.

BACKGROUND OF THE INVENTION

The inventive concept disclosed herein relates to an electronic device and a method of manufacturing the same and more particularly, to a stretchable electronic device and a method of manufacturing the same.

A stretchable electronic device may maintain electrical functions even if a substrate is expanded by the stress applied from the outside. The stretchable electronic device has applicability in various fields, including sensor skin for a robot, a wearable communication element, a bio element embedded in/attached to a human body, a next-generation display beyond the limits of a simple bendable and/or flexible element.

A typical stretchable electronic device has a structure in which metal interconnection may be expanded. The metal interconnection may be transferred to the surface of a pre-strained stretchable substrate and then formed in a wave shape by the contraction of the stretchable substrate. The metal interconnection may give stretchability to an electronic device. However, a typical stretchable electronic device experiences the restriction of the strechability of the metal interconnection by the amount of the pre-strain initially applied to a substrate. In addition, the wave-shaped metal interconnection has a drawback that it is difficult to be applied to a large area and ensure reliability, because its manufacturing processes are complex compared to general semiconductor device manufacturing processes.

Another typical stretchable electronic device may include the interconnection of a stretchable material with conductivity instead of metal. The conductive stretchable material mainly includes conductive materials, such as conductive polymer, carbon nano tube, graphene, etc.

However, the conductive stretchable material may have drawbacks that it has higher electric resistance compared to metal while having high expandability and it has a difficulty in applying fine patterning of a micrometer level.

Still another typical stretchable electronic device may include interconnection in the shape of a 2D plane spring. It is easy for the spring-shaped interconnection to reduce costs and ensure reliability because related interconnection manufacturing processes are compatible with general semiconductor device processes, and the spring-shaped interconnection may have high conductivity. However, the spring-shaped interconnection has a limit in increasing an expanding rate because strain is locally concentrated on only a specific part of interconnection and damage occurs when being stretched.

SUMMARY OF THE INVENTION

The inventive concept provides a stretchable electronic device with a 3D coil interconnection and a method of manufacturing the same.

The inventive concept also provides a stretchable electronic device and a method of manufacturing the same that may minimize or remove the open of coil interconnection.

Embodiments of the inventive concept provide methods of manufacturing a stretchable electronic device including forming coil interconnections on a first substrate; forming a first stretchable insulating layer that covers the coil interconnection; forming a second substrate on the first stretchable insulating layer; separating the first substrate from the coiling interconnection and the first stretchable insulating layer; and forming a transistor on the coil interconnection.

In some embodiments, the forming of the coil interconnection may include forming a sacrificial layer on the first substrate; forming first interconnections on the sacrificial layer; forming pillar interconnections on the first interconnections; and forming second interconnections on the pillar interconnections.

In other embodiments, the sacrificial layer may include a photoresist, polysilicon, silicon oxide, or silicon nitride film.

In still other embodiments, the separating of the first substrate may include removing the sacrificial layer.

In even other embodiments, the forming of the first interconnections may include forming a first seed layer on the sacrificial layer; forming a first photoresist pattern on a part of the first seed layer; and forming a first cap interconnection layer on the first seed layer exposed by the first photoresist pattern.

In yet other embodiments, the first cap interconnection layer may be formed by an electroplating method.

In further embodiments, the forming of the pillar interconnections may include forming a second photoresist pattern layer on the first cap interconnection layer and the first seed layer; and forming pillar interconnection on the first cap interconnection layer.

In still further embodiments, the forming of the second interconnection may include forming a second seed layer on the pillar interconnection and the second photoresist pattern; forming a third photoresist pattern on a part of the second seed layer; and forming a second cap interconnection layer on the second seed layer exposed from the third photoresist pattern.

In even further embodiments, the forming of the coil interconnection may further include removing the third photoresist pattern and the second seed layer exposed from the second cap interconnection layer. The second seed layer may be etched.

In yet further embodiments, the forming of the coil interconnection may further include comprising removing the second photoresist pattern and the first seed layer exposed from the first cap interconnection layer. The first seed layer may be etched.

In much further embodiments, the present disclosure may further include, after the forming of the transistor, forming a second stretchable insulating layer; and removing the second substrate.

In other embodiments of the inventive concept, a stretchable electronic device includes a stretchable insulating layer; transistors in the stretchable insulating layer; and interconnection that is coupled in zigzag between the transistors and is stretched by the contraction or expansion of the stretchable insulating layer.

In some embodiments, the stretchable insulating layer may include elastomer.

In other embodiments, the elastomer may include PDMS.

In still other embodiments, the interconnection may include coil interconnection.

In even other embodiments, the coil interconnection may include first interconnection; pillar interconnection formed on the first interconnection; and second interconnection formed on the pillar interconnection.

In yet other embodiments, the first interconnection may include a first seed layer and a first cap interconnection layer, and the second interconnection may include a second seed layer and a second cap interconnection layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

It should be construed that foregoing general illustrations and following detailed descriptions are exemplified and an additional explanation of claimed inventions is provided. Therefore, the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. If the specification describes that a certain part includes a certain component, this means that it may further include other different components. In addition, an embodiment described and exemplified herein includes a complementary embodiment thereof. Embodiments of the inventive concept will be described in detail below with reference to the accompanying drawings.

Figure 1:
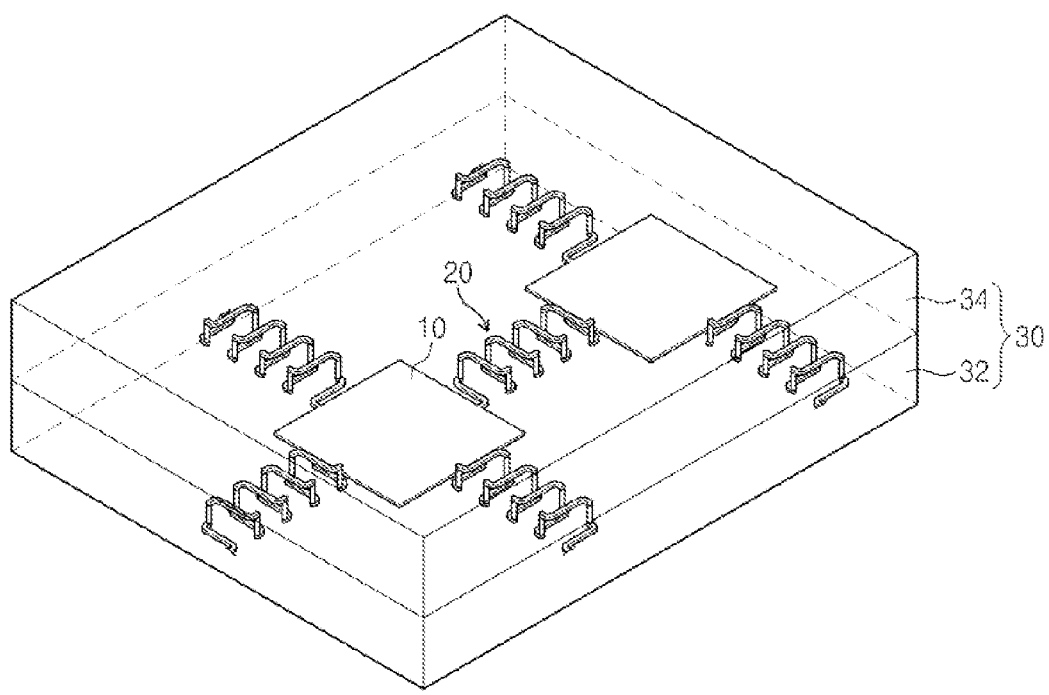
FIG. 1 is a perspective view schematically representing a stretchable electronic device according to an embodiment of the inventive concept.
Figure 2:
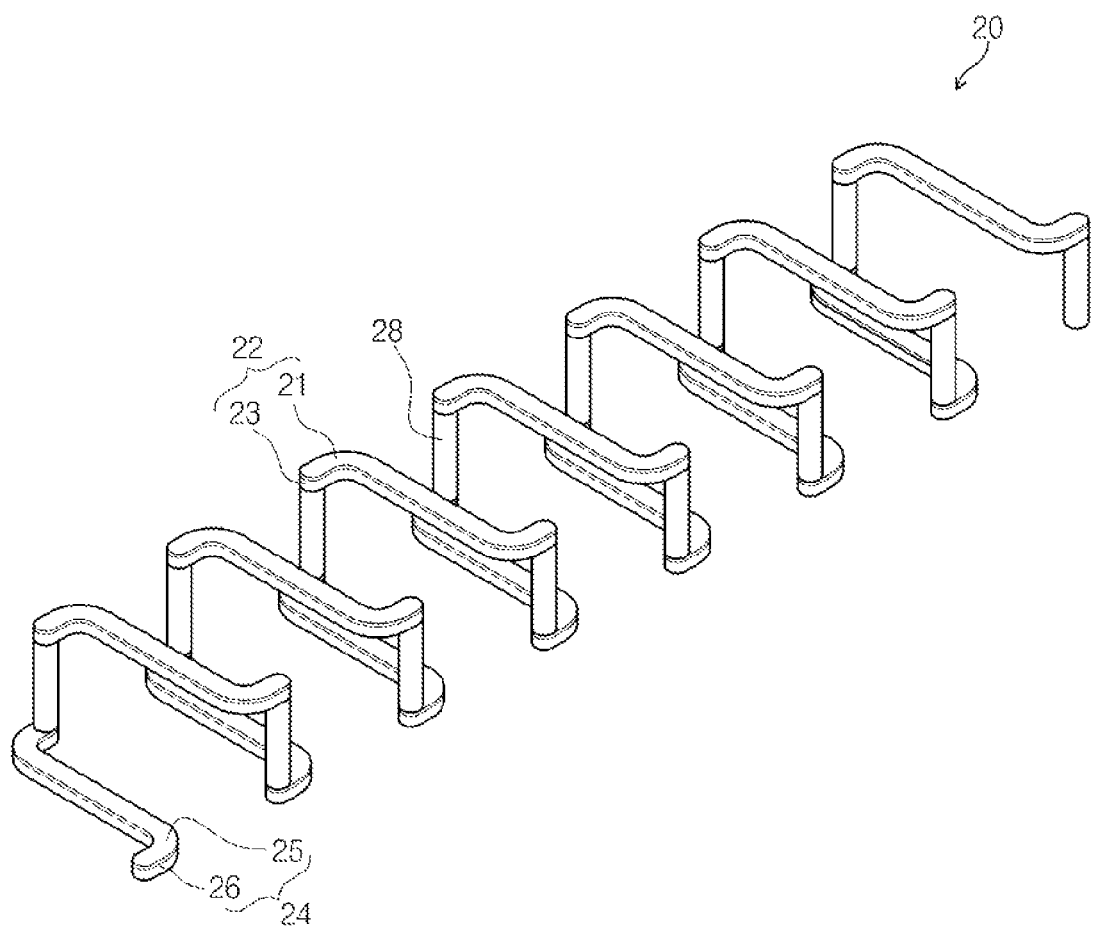
FIG. 2 is a perspective view representing the coil interconnection of FIG. 1.
Figure 3:
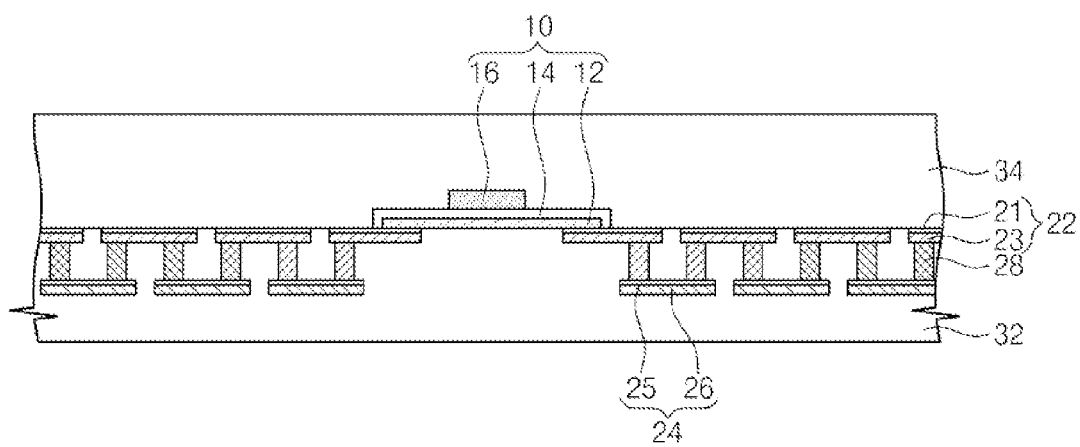
FIG. 3 is a cross sectional view of FIG. 1.

FIG. 1 is a perspective view schematically representing a stretchable electronic device according to an embodiment of the inventive concept. FIG. 2 is a perspective view representing the coil interconnection of FIG. 1. FIG. 3 is a cross sectional view of FIG. 1.

Referring to FIGS. 1 through 3, the stretchable electronic device of the inventive concept may include transistors 10, coil interconnections 20, and a stretchable insulating layer 30. The transistors 10 and coil interconnections 20 may be arranged in the stretchable insulating layer 30. The transistor 10 may include an activated layer 12, a gate insulating film 14, and a gate electrode 16. The activated layer 12 may be coupled to the coil interconnection 20. Although not illustrated, the activated layer 12 may have a source/drain region on the coil interconnection 20. The source/drain region may be doped with a conductive dopant. The gate insulating film 14 covers the activated layer 12. The gate electrode 16 is overlapped with the activated layer 12.

The coil interconnection 20 may be stretchable in the stretchable insulating layer 30. The coil interconnection 20 may include lower interconnections 24, pillar interconnections 28, and upper interconnections 22. The lower interconnections 24, pillar interconnections 28, and upper interconnections may be 3-dimensionally coupled. The pillar interconnections 28 may couple the lower interconnections 24 to the upper interconnections 22. The lower interconnections 24 and upper interconnections 22 may be extended in zigzag. When the stretchable insulating layer 30 is stretched, the lower interconnections 24 and upper interconnections 22 may be uniformly stretched. The coil interconnection 20 prevents local strain from becoming concentrated. Thus, the stretchable electronic device according to the inventive concept may minimize or remove the open of the coil interconnection 20.

The lower interconnection 24 may include a lower seed layer 25 and a lower cap interconnection layer 26. The upper interconnection 22 may include an upper seed layer 21 and an upper cap interconnection layer 23. The pillar interconnection 28 may be coupled between the upper cap interconnection layer and the lower seed layer 25.

The stretchable insulating layer 30 may make the coil interconnection 20 stretchable. The coil interconnection 20 may be stretched by the expansion or contraction of the stretchable insulating layer 30. The stretchable insulating layer 30 may be elastically strained by external tensile stress. The stretchable insulating layer 30 may include elastomer, such as PDMS (Poly-Dimethyllesiloxane).

A method of manufacturing the stretchable electronic device according to the embodiment of the inventive concept that is configured in these ways is described in the following.

FIGS. 4 through 22 are cross sectional views of processes representing a method of manufacturing the stretchable electronic device according an embodiment of the inventive concept on the basis of FIG. 3.

Figure 4:
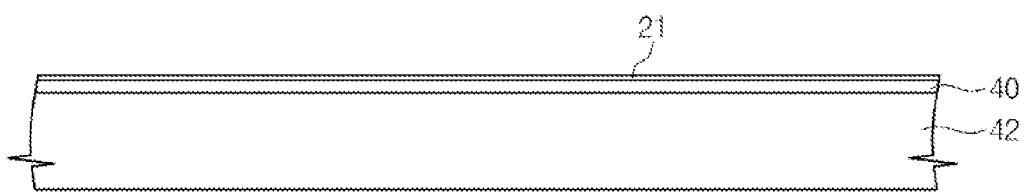
FIGS. 4 through 22 are cross sectional views of processes representing a method of manufacturing a stretchable electronic device according to an embodiment of the inventive concept on the basis of FIG. 3.

Referring to FIG. 4, a sacrificial layer 40 and an upper seed layer 21 are formed on a first substrate 42. The first substrate 42 may include a flat substrate, such as silicon wafer or glass. The sacrificial layer 40 may include a photoresist, polysilicon, silicon oxide, or silicon nitride film that is formed by a spin coating method. The upper seed layer 21 includes metal, such as Au, Ag, Cu, Al, W, Ti, Cr, etc. The metal may be formed by a sputtering method or a thermal evaporation method.

Figure 5:
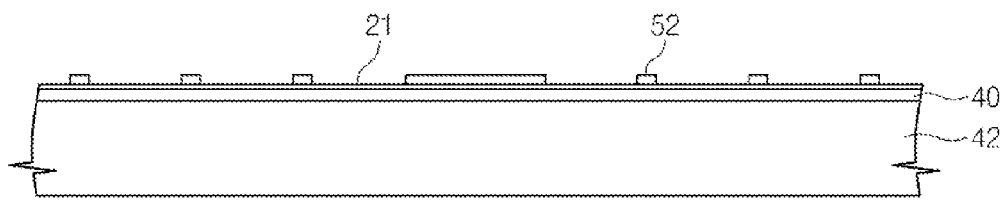

Referring to FIG. 5, a first photoresist pattern 52 is formed on the upper seed layer 21. The photoresist pattern 52 may be formed by a general photolithographic process.

Figure 6:
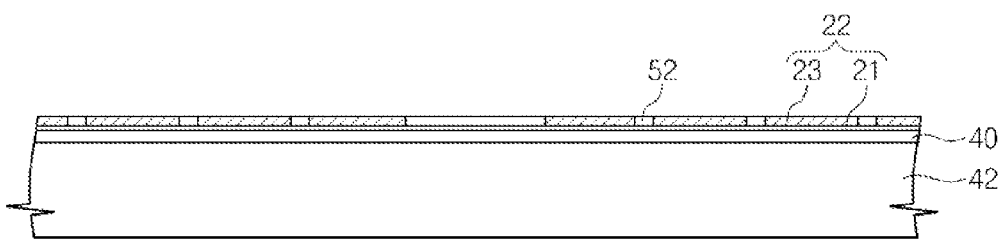

Referring to FIG. 6, an upper cap interconnection layer 23 is formed on the upper seed layer 21 exposed from the first photoresist pattern 52. The upper seed layer 21 may include copper formed by an electroplating method. Subsequently, the first photoresist pattern 52 may be removed.

Figure 7:
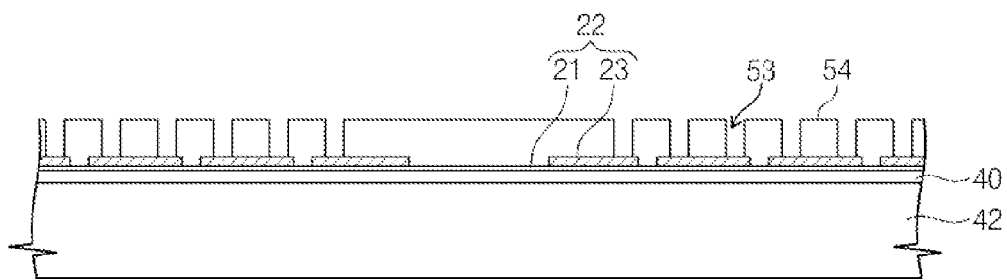

Referring to FIG. 7, a second photoresist pattern 54 is formed on a part of the upper cap interconnection layer 23 and on the first photoresist pattern 52 (already removed above). The second photoresist pattern 54 may be formed by the same photolithographic process as the first photoresist pattern 52. The second photoresist pattern 54 may have a contact hole 53. The contact hole may expose the upper cap interconnection layer 23.

Figure 8:
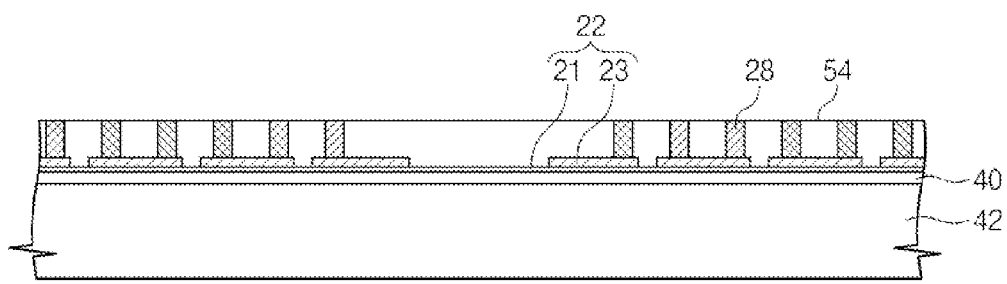

Referring to FIG. 8, a pillar interconnection 28 is formed in the contact hole 53. The pillar interconnection 28 may be formed on the upper cap interconnection layer 23. The pillar interconnection 28 may include copper formed by an electroplating method.

Figure 9:
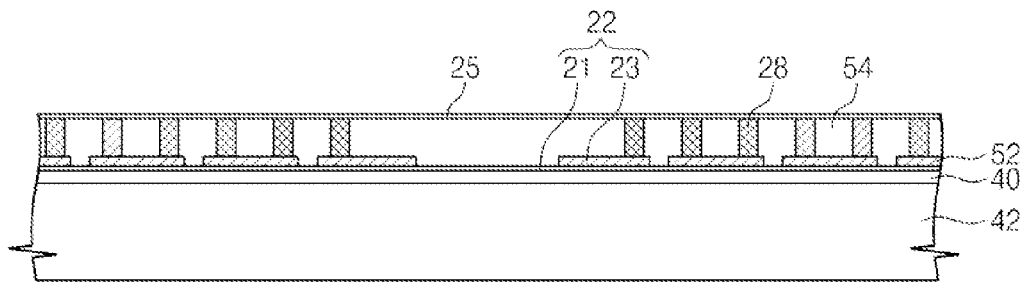

Referring to FIG. 9, the lower seed layer 25 is formed on the pillar interconnection 28 and second photoresist pattern 54. The lower seed layer 25 may be formed by a sputtering method or a thermal evaporation method. The lower seed layer 25 may include metal, such as Au, Ag, Cu, Al, W, Ti, Cr, etc.

Figure 10:
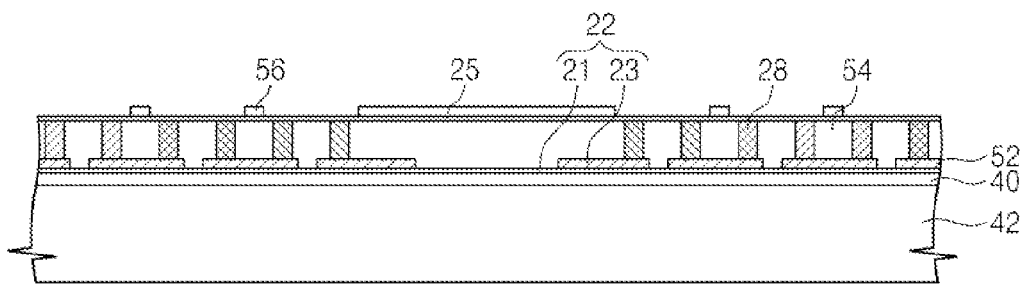

Referring to FIG. 10, a third photoresist pattern 56 is formed on a part of the lower seed layer 25. The third photoresist pattern 56 may be formed by a photolithographic process.

Figure 11:
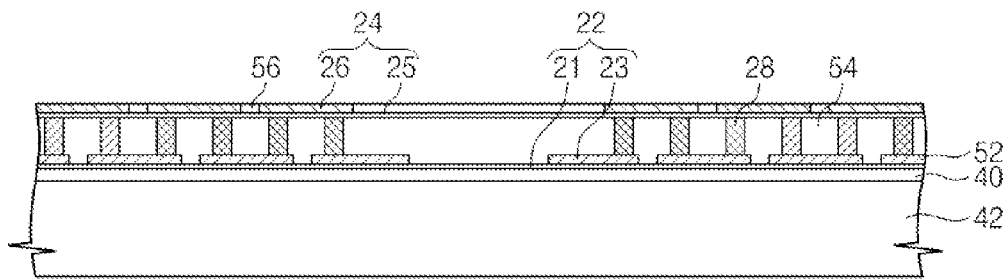

Referring to FIG. 11, a lower cap interconnection layer 26 is formed on the lower seed layer 25 exposed by the third photoresist pattern 56. The lower cap interconnection layer 26 may include copper formed by an electroplating method.

Figure 12:
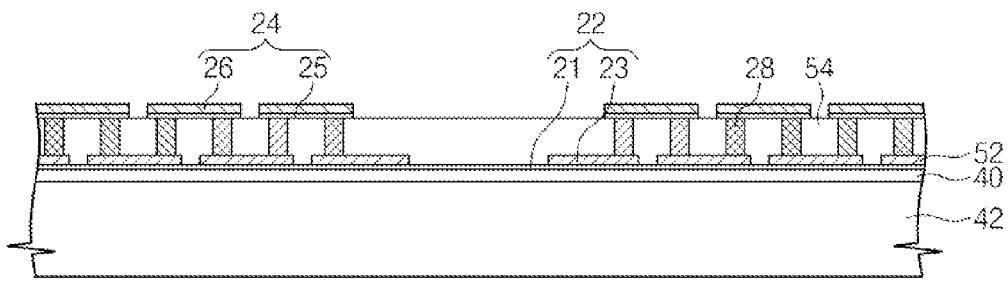

Referring to FIG. 12, the third photoresist pattern 56 and a part of the lower seed layer 25 are removed. The third photoresist pattern 56 may be removed by organic solvent. The organic solvent may include alcohol with high volatility. The lower seed layer 25 exposed from the lower cap interconnection layer 26 may be removed by an etching process.

Figure 13:
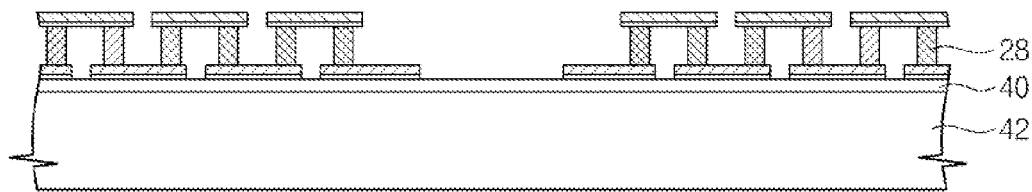

Referring to FIG. 13, the second photoresist pattern 54 and a part of the upper seed layer 21 are removed. The second photoresist pattern 54 may be removed by organic solvent. The upper seed layer 21 exposed from the upper cap interconnection layer 23 may be removed by an etching process.

Figure 14:
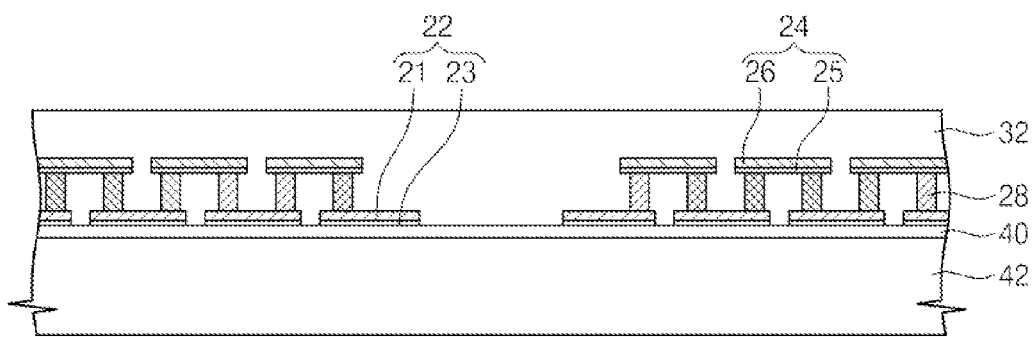

Referring to FIGS. 2 and 14, a lower stretchable insulating layer 32 covering the coil interconnection 20 is formed. The lower stretchable insulating layer 32 may include elastomer, such as PDMS (Poly-Dimethyllesiloxane). The lower stretchable insulating layer 32 may bury the coil interconnection 20.

Figure 15:
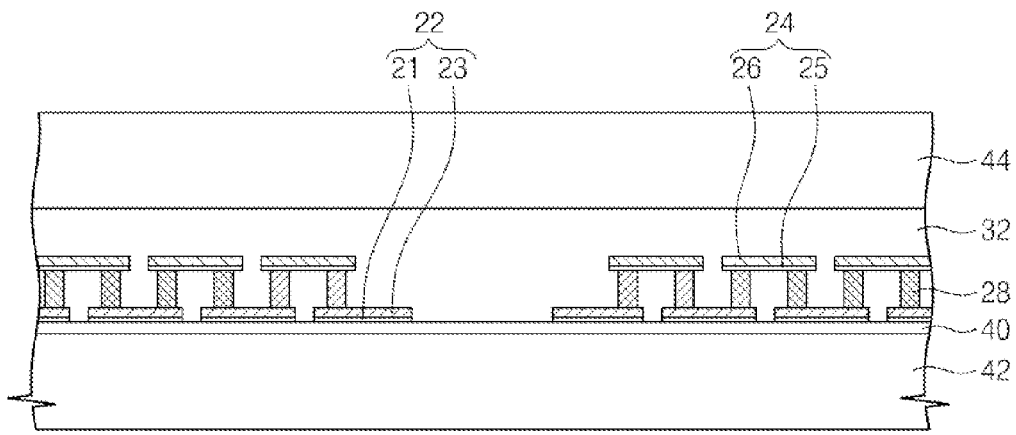

Referring to FIG. 15, a second substrate 44 is formed on the lower stretchable insulating layer 32. The second substrate 44 may include a silicon wafer, a plastic substrate, or glass.

Figure 16:
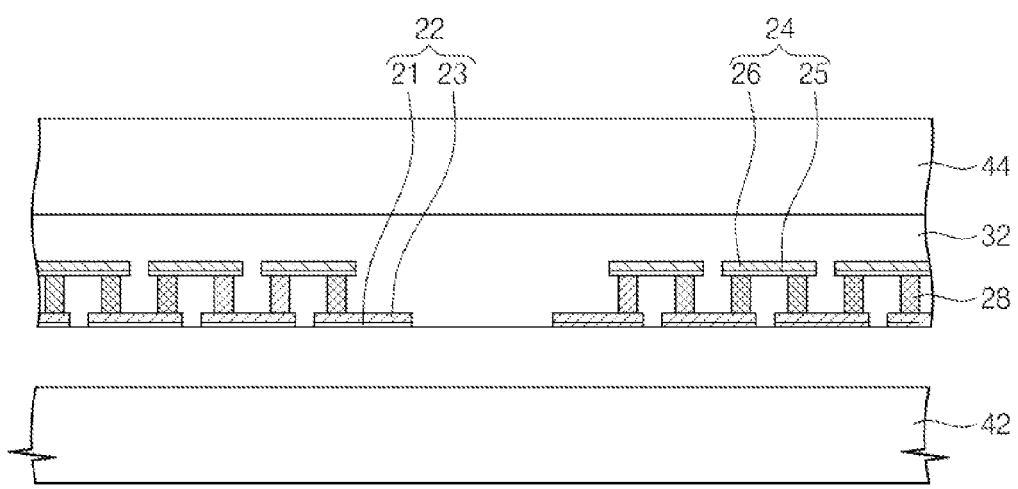

Referring to FIG. 16, the sacrificial layer 40 is removed to separate the first substrate 42 from the upper interconnection 22 and the lower stretchable insulating layer 32. The sacrificial layer 40 may be removed by organic solvent in the case of a photoresist layer. The sacrificial layer 40 may be removed by a wet etching process after the removing of the first substrate 42 in the case of a silicon oxide film. The first substrate 42 may be removed by a chemical mechanical grinding process. Although not illustrated, the upper seed layer 21 may be removed from the whole surface of the substrate. The coil interconnection 20 and the lower stretchable insulating layer 32 may be transferred to the second substrate 44.

Figure 17:
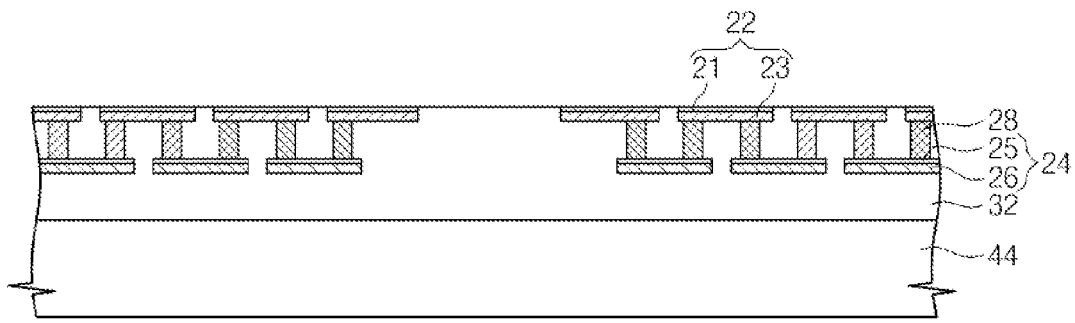

Referring to FIGS. 2 and 17, the second substrate 44 and coil interconnection 20 are turn upside down. The upper seed layer 21 of the upper interconnection 22 may be arranged on the second substrate 44.

Figure 18:
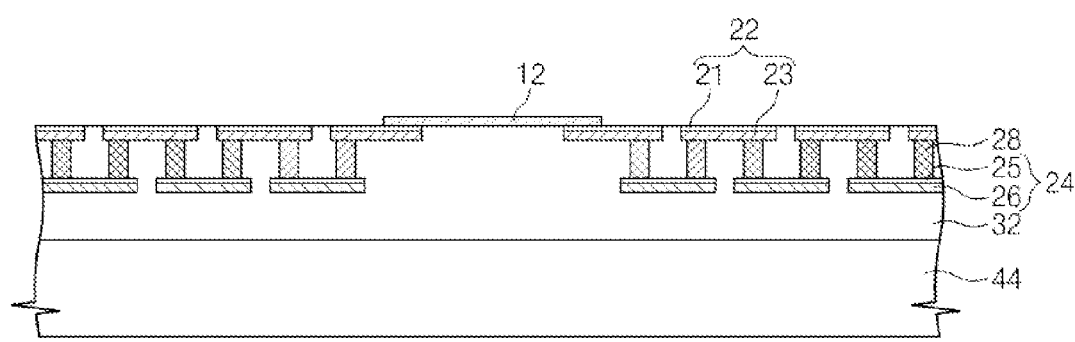

Referring to FIG. 18, an activated layer 12 is formed on the lower stretchable insulating layer 32 between the upper interconnections 22 and the upper interconnections 22. The activated layer may include poly silicon, an organic semiconductor material. The poly silicon may be formed by chemical vapor deposition, photolithographic and etching processes. The organic semiconductor material may be formed by inkjet printing and spin coating processes.

Figure 19:
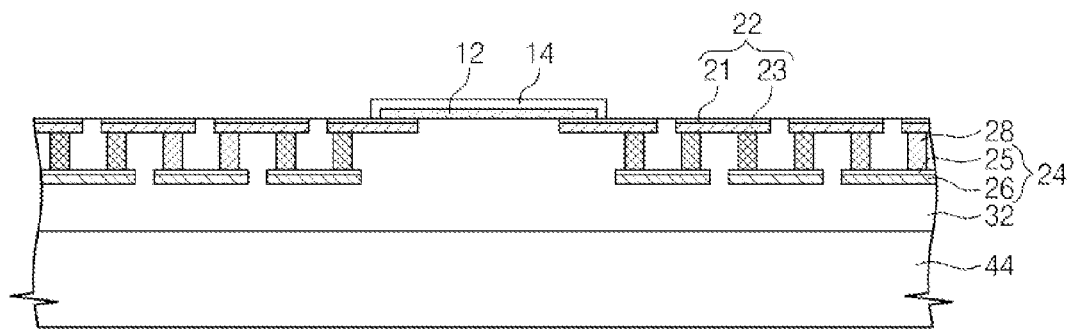

Referring to FIG. 19, a gate insulating film 14 is formed on the activated layer 12. The gate insulating film 14 may include a silicon oxide film or a silicon nitride film, an organic insulating film, etc. The gate insulating film 14 may be formed by deposition, photolithographic, etching, inkjet printing, and spin coating processes.

Figure 20:
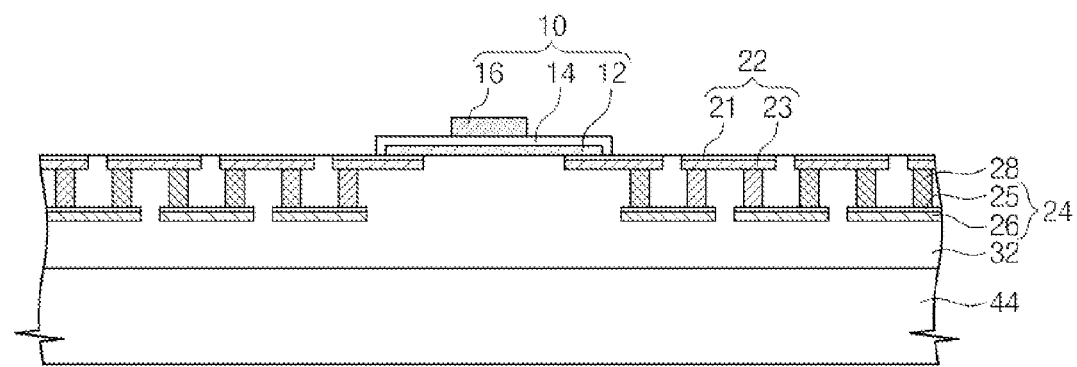

Referring to FIG. 20, a gate electrode 16 is formed on the gate insulating film 14. The gate electrode 16 may include conductive metal. The gate electrode may be formed by a deposition process, a photolithographic process, an etching process, and a deposition process through a shadow mask.

Figure 21:
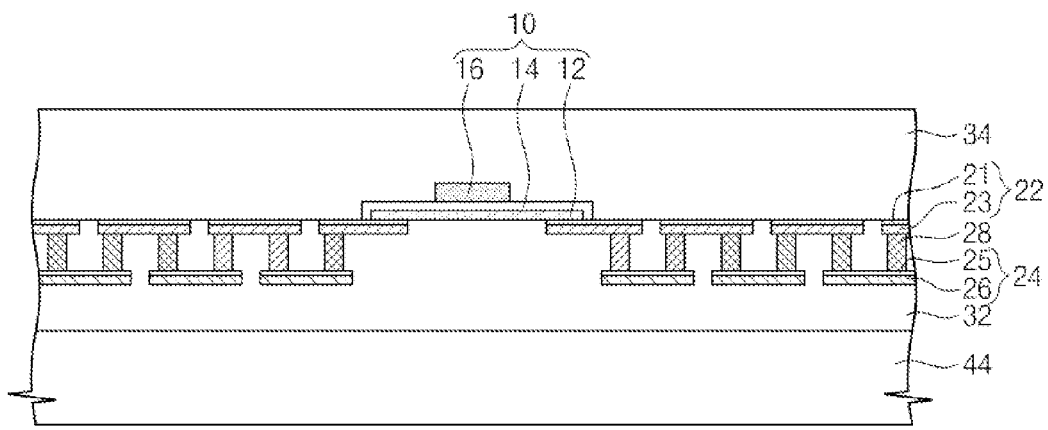

Referring to FIG. 21, an upper stretchable insulating layer 34 is formed on the transistor 10 and coil interconnection 20. The upper stretchable insulating layer 34 may include elastomer, such as PDMS.

Figure 22:
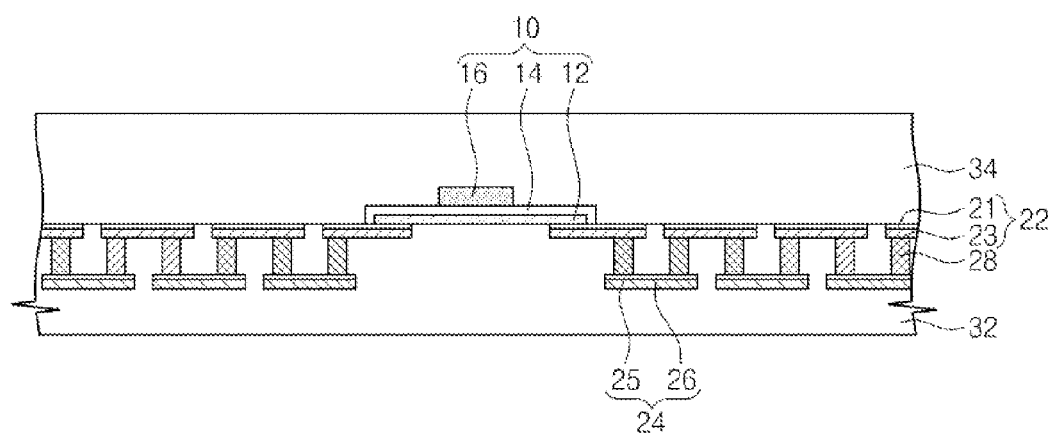

Referring to FIG. 22, the second substrate 44 is separated from the lower stretchable insulating layer 32. The second substrate 44 may be removed or peeled off from the lower stretchable insulating layer 32 by external force. In addition, the second substrate 44 may be removed by a chemical mechanical grinding process.

The stretchable electronic device according to an embodiment of the inventive concept may include a transistor, a coil interconnection, and a stretchable insulating layer. The transistor and the coil interconnection are arranged in the stretchable insulating layer. The coil interconnection may be 3-dimensionally formed by a photolithographic process and an electroplating method. The coil interconnection may include lower interconnections, upper interconnections, and pillar interconnections. The upper and lower interconnections may be extended in zigzag. The zigzagged coil interconnection may hold back the concentration of strain when the stretchable insulating layer is contracted or expanded. Thus, the stretchable electronic device according to the embodiment of the inventive concept may minimize or remove the open of the coil interconnection.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the inventive concept.

What is claimed is:

1. A method of manufacturing a stretchable electronic device, the method comprising:
    forming coil interconnections on a first substrate;
    forming a first stretchable insulating layer that covers the coil interconnection;
    forming a second substrate on the first stretchable insulating layer;
    separating the first substrate from the coiling interconnection and the first stretchable insulating layer; and
    forming a transistor on the coil interconnection.

2. The method of claim 1, wherein the forming of the coil interconnection comprises:
    forming a sacrificial layer on the first substrate;
    forming first interconnections on the sacrificial layer;
    forming pillar interconnections on the first interconnections; and
    forming second interconnections on the pillar interconnections.

3. The method of claim 2, wherein the sacrificial layer comprises a photoresist, polysilicon, silicon oxide, or silicon nitride film.

4. The method of claim 2, wherein the separating of the first substrate comprises removing the sacrificial layer.

5. The method of claim 4, wherein the forming of the first interconnections comprises:
    forming a first seed layer on the sacrificial layer;
    forming a first photoresist pattern on a part of the first seed layer; and
    forming a first cap interconnection layer on the first seed layer exposed by the first photoresist pattern.

6. The method of claim 5, further comprising, after the forming of the first interconnections, removing the first photoresist pattern.

7. The method of claim 5, wherein the first cap interconnection layer is formed by an electroplating method.

8. The method of claim 5, wherein the forming of the pillar interconnections comprises:
   forming a second photoresist pattern layer on the first cap interconnection layer and the first seed layer; and
   forming pillar interconnection on the first cap interconnection layer.

9. The method of claim 8, wherein the forming of the second interconnections comprises:
   forming a second seed layer on the pillar interconnection and the second photoresist pattern;
   forming a third photoresist pattern on a part of the second seed layer; and
   forming a second cap interconnection layer on the second seed layer exposed from the third photoresist pattern.

10. The method of claim 9, wherein the forming of the coil interconnection further comprises removing the third photoresist pattern and the second seed layer exposed from the second cap interconnection layer.

11. The method of claim 10, wherein the second seed layer is etched.

12. The method of claim 9, further comprising removing the second photoresist pattern and the first seed layer exposed from the first cap interconnection layer.

13. The method of claim 12, wherein the first seed layer is etched.

14. The method of claim 1, further comprising:
   after the forming of the transistor, forming a second stretchable insulating layer; and
   removing the second substrate.

* * * * *